United States Patent [19]
Tagata et al.

[11] Patent Number: 5,896,652
[45] Date of Patent: Apr. 27, 1999

[54] METHOD OF PACKAGING ELECTRONIC COMPONENTS

[75] Inventors: Genichi Tagata; Tomohide Uchida, both of Hamamatsu, Japan

[73] Assignee: Tenryu Technics Co., Ltd., Hamamatsu, Japan

[21] Appl. No.: 08/848,297

[22] Filed: Apr. 29, 1997

[30] Foreign Application Priority Data

May 8, 1996 [JP] Japan .................................. 8-113311
Apr. 16, 1997 [JP] Japan .................................. 9-098547

[51] Int. Cl.$^6$ ...................................................... H05K 3/30
[52] U.S. Cl. .................................. 29/833; 29/740; 29/834
[58] Field of Search ............................ 29/833, 740, 840, 29/834

[56] References Cited

U.S. PATENT DOCUMENTS

| | | |
|---|---|---|
| 4,348,276 | 9/1982 | Tateishi et al. . |
| 4,738,025 | 4/1988 | Arnold .................................. 29/833 X |
| 4,809,430 | 3/1989 | Maruyama et al. . |
| 4,979,290 | 12/1990 | Chiba .................................... 29/833 X |
| 5,003,692 | 4/1991 | Izumi et al. ........................... 29/833 X |
| 5,048,178 | 9/1991 | Bindra et al. .......................... 29/833 X |
| 5,079,834 | 1/1992 | Itagaki et al. .......................... 29/740 X |
| 5,379,514 | 1/1995 | Okuda et al. .............................. 29/833 |
| 5,384,956 | 1/1995 | Sakarai et al. ......................... 29/833 X |
| 5,456,003 | 10/1995 | Yamamoto et al. ................... 29/833 X |
| 5,457,880 | 10/1995 | McKinley et al. ........................ 29/833 |
| 5,501,005 | 3/1996 | Onitsuka .................................. 29/833 |
| 5,649,356 | 7/1997 | Gieskes .................................... 29/833 |
| 5,787,577 | 8/1998 | Kent ........................................ 29/833 |

FOREIGN PATENT DOCUMENTS

| | | | |
|---|---|---|---|
| 2 569 935 | 3/1986 | France .................................... 29/833 |
| 59-107 202 | 6/1984 | Japan ..................................... 29/833 |

*Primary Examiner*—Carl J. Arbes
*Attorney, Agent, or Firm*—Kanesaka & Takeuchi

[57] ABSTRACT

The present invention provides a method of packaging an electronic component, which permits improvement of mounting accuracy of various components against non-uniform deformation of the printed circuit board, and simplification of the correcting operation. The method of the present invention comprises the steps of dividing the printed circuit board c to be placed on the packaging section m into a plurality of prescribed areas $c1 \ldots$ , determining a reference origin $a1 \ldots$ for mounting the electronic component for each of the plurality of areas, setting the resultant coordinates in the control means 1, measuring a reference origin for each of the plurality of areas by means of detecting means prior to packaging, calculating and setting a correction origin for each area through the control means 1 on the basis of this measurement, controlling the mounting head 2 individually for each area, and mounting the prescribed electronic component.

5 Claims, 9 Drawing Sheets

METHOD OF PACKAGING ELECTRONIC COMPONENTS

BACKGROUND OF THE INVENTION

1. Field of the Invention

The present invention relates to a method of packaging an electronic component applicable in an industry for assembling or mounting electric components.

2. Description of the Related Art

In industrial sectors in which electronic components such as a chip component and an IC component are mounted on a printed circuit board, external heat action or the like often causes a longitudinal or transverse expansion and contraction of the printed circuit board during or before mounting an electronic component onto the printed circuit board, partly because the use of materials having a high thermal conductivity has become common.

The mounting position of an electronic component onto the printed circuit board is previously programmed into a controller so as to permit sequential processing in accordance with such a positional value.

When mounting the electronic component in accordance with this program, therefore, there occurs a shift of the mounting position by an amount of change in expansion or contraction, thus resulting in an inaccurate mounting position and hence in occurrence of defectives.

It is therefore necessary, prior to mounting, to correct data in the foregoing program in compliance with the expansion/contraction ratio of the printed circuit board, and for this purpose, there is known a method disclosed in Japanese Examined Patent Publication No. 7-38519.

In this method, as shown in FIG. 9, when the lengths L1 and L2 between the recognition marks a and b and between b and c placed on the printed circuit board 50 show changes in the X-axis and the Y-axis directions by heat or the like into lengths L1' and L2' between the recognition marks a' and b' and between b' and c', it has been the conventional practice to calculate changes on the X-axis and Y-axis, respectively, from contraction ratios at X-axis=L1'/L1 and Y-axis=L2'/L2, and correct the coordinates of the mounting position as a whole on the printed circuit board 50 on the basis of the values thereof.

However, these changes in expansion and contraction of the printed circuit board are not uniform throughout the entire board, but are often non-uniform between different portions thereof. A proportional correction with multiplication and division of the contraction ratio cannot give a sufficient positional accuracy of mounting, and a larger value of coordinates leads to a proportional increase in error of the correction of multiplication/division of the foregoing contraction ratio, thus further reducing the mounting coordinates.

The conventional art had these various problems as described above.

SUMMARY OF THE INVENTION

The present invention was developed to solve these problems, and has an object to provide a method of packaging an electronic component which permits improvement of mounting accuracy of various portions and simplification of the correcting operation thereof against non-uniform expansion or contraction deformation of a printed circuit board, by dividing the printed circuit board into a plurality of prescribed areas, determining a reference origin for mounting an electronic component for each area, previously setting the resultant coordinates in control means, measuring a reference origin with detecting means for each of the plurality of areas prior to packaging, calculating and setting a corrected origin for each area from the reference origin set in the foregoing control means on the basis of this measurement, individually causing control of a mounting head for each area with reference to the foregoing corrected origin for each area, and then mounting the prescribed electronic component.

The present invention provides, as means to achieve the foregoing object, a method of packaging an electronic component, comprising receiving the electronic component from a supply section by means of a mounting head movable in the X and the Y directions in accordance with a prescribed program entered into control means and mounting the electronic components onto a packaging section, which comprises:

a step of dividing a printed circuit board to be mounted in the packaging section into a plurality of prescribed areas, determining a reference origin for each area for mounting the electronic components, and setting the resultant coordinates previously in the control means;

a step of, prior to packaging the electronic components into the printed circuit board, measuring a reference origin for each of the areas with a detecting means;

a step of calculating and setting a corrected origin for each area by said control means on the basis of said measurement; and a step of causing control of a mounting head for each area with reference to said corrected origin for each area to mount prescribed electronic components.

The present invention provides an embodiment of the method of packaging electronic components, wherein the calculation of the corrected origin in the step of calculating and setting the corrected origin is carried out through addition/subtraction of a detected value of the detecting means and the previously set reference value.

The present invention provides another method of packaging electronic components, comprising receiving electronic components from a supply section by means of a mounting head movable in the X and the Y directions in accordance with an entered program and mounting the electronic components sequentially onto a printed circuit board in a packaging section, which comprises the steps of:

dividing the printed circuit board into a plurality of areas and determining a reference origin on the printed circuit board for each of the thus divided areas;

previously entering coordinates in the X and the Y directions of the mounting position of the electronic component based on the reference origin on the printed circuit board into the program;

when the printed circuit board is determined to have no deformation, carrying out the following steps so that the coordinates of the reference origin for each of the divided areas on the printed circuit board agree with the coordinates based on the reference origin on the packaging section corresponding to the foregoing coordinates, to the printed circuit board placed at a predetermined position on the packaging section:

detecting one of the reference origins on the printed circuit board for each of the divided areas by means of detecting means; comparing the coordinates based on the reference origin on the packaging section obtained from the detection with the coordinates based on the reference origin on the packaging section corresponding to the coordinates of the detected one of the reference origins on the printed circuit board; when values of the coordinates are different, correcting the coordinates in the X and the Y directions of the mounting position of the electronic component based on the reference origin on the printed circuit board within an area to which the reference origin on the printed circuit board in the program belongs in response to the difference; and controlling the mounting head on the basis of this correction, thereby placing the electronic component on the packaging section.

The present invention provides an embodiment of the foregoing method, wherein:

when comparing the coordinates (X', Y') based on the reference origin on the packaging section, resulting from detection, and the coordinates (X, Y) based on the reference origin on the packaging section corresponding to the coordinates of the one of the reference origins on the printed circuit board, and if the values of the coordinates (X'>X, Y'>Y) are different, the coordinates in the X and the Y directions (X'–X, Y'–Y) of the mounting position of the electronic component based on the reference origin on the printed circuit board within an area to which the reference origin on the printed circuit board in the program belongs is corrected through addition in response to the difference.

The present invention provided another embodiment of the foregoing method, wherein:

when comparing the coordinates (X", Y") based on the reference origin on the packaging section, resulting from detection, and the coordinates (X, Y) based on the reference origin on the packaging section corresponding to the coordinates of the one of the reference origins on the printed circuit board, and if the values of the coordinates (X>X", Y>Y") are different, the coordinates in the X and the Y directions (X–X", Y–Y") of the mounting position of the electronic component based on the reference origin on the printed circuit board within an area to which the reference origin on the printed circuit board in the program belongs is corrected through subtraction in response to the difference.

DESCRIPTION OF THE PREFERRED EMBODIMENTS

The present invention having the construction as described above have the following functions.

A printed circuit board placed on a packaging section is divided on control means into a plurality of areas, and a reference origin previously determined for each of the areas is entered into the control means.

Upon mounting of an electronic component onto the printed circuit board, the individual reference origins provided on the printed circuit board are measured with detecting means, and the set origin value and the actual measured origin value are compared. When these set and measured values are different, the mounting origin coordinates are corrected through addition or subtraction of these values, and the result is entered into the control means.

The electronic components received from the supply section are mounted for each area on the basis of the corrected origin for each area.

Now, an embodiment of the method of packaging an electronic component of the present invention will be described below with reference to the drawings.

Figure 1:
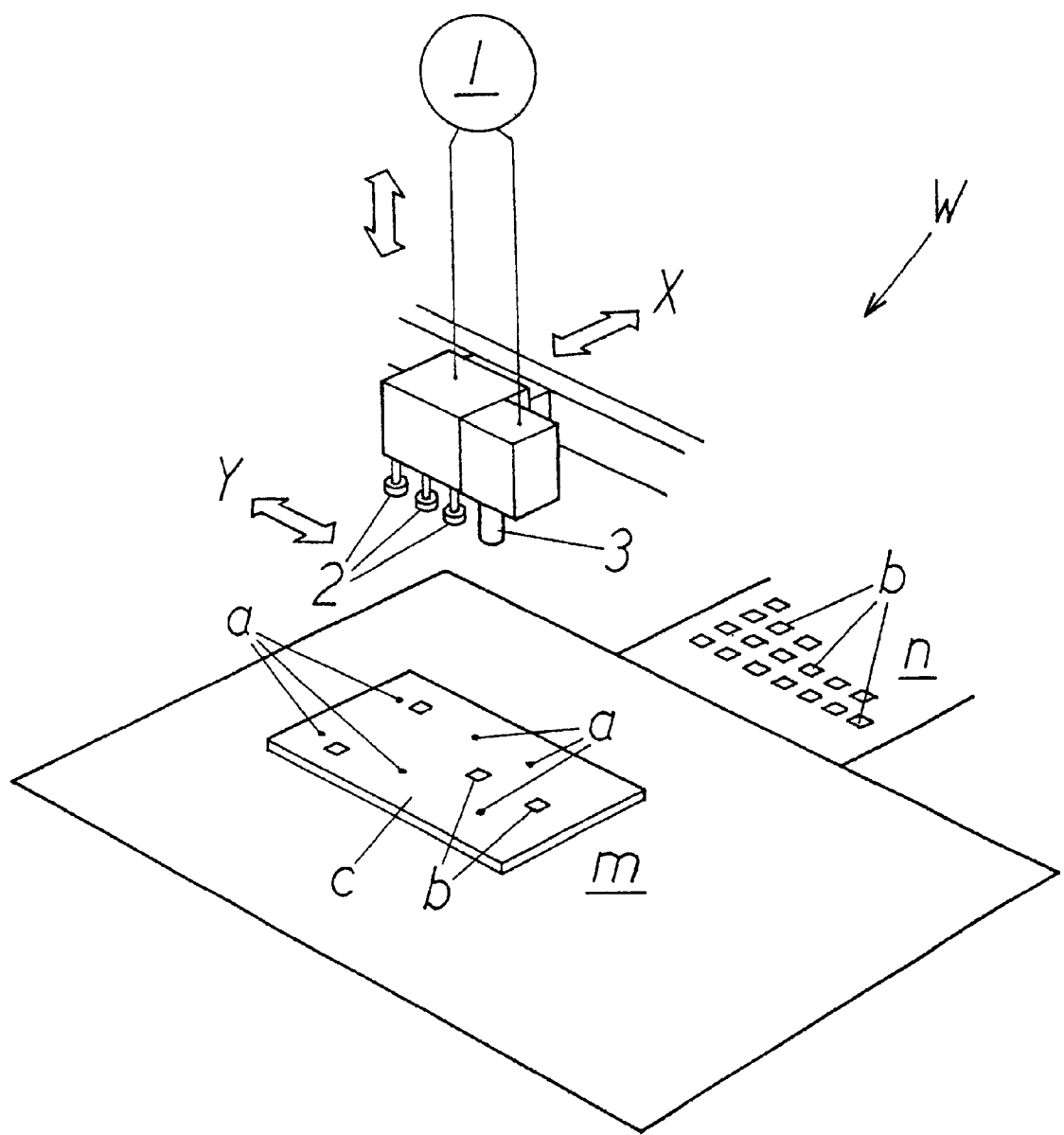
FIG. 1 is a schematic perspective view illustrating an embodiment of an electronic component packaging unit adopting the method of packaging an electronic component of the present invention.

An embodiment of the present invention comprises the steps, as shown in FIG. 1, of transferring electronic components b such as chip components or IC components received from the supply section n to a packaging section m, and mounting a prescribed number of such components onto appropriate positions on a printed circuit board c. Mounting at a prescribed position is accomplished by means of a packaging machine provided with a mounting head 2 movable in the X-axis and the Y-axis directions in accordance with a predetermined program entered into the control means 1 via a known computer.

When mounting an electronic component b onto a printed circuit board c, the mounting position is detected with detecting means 3 comprising a visual sensor such as a CCD camera, and the resultant signal is sent to the control means 1. The detected value is compared with a value of the previously set program for calculation, and when these values are different, correction is made in compliance with the difference.

Figure 2:
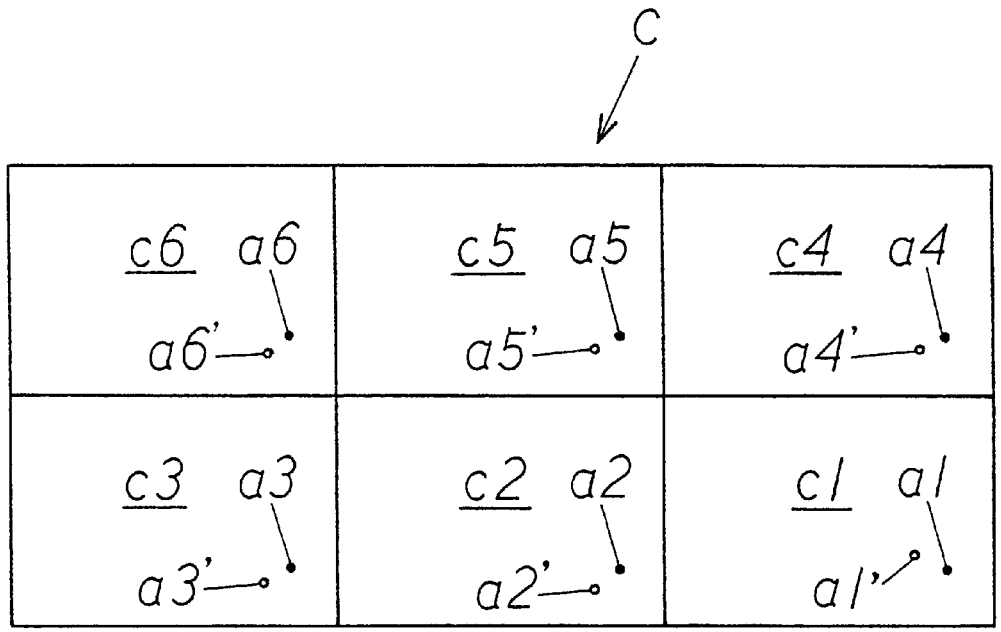
FIGS. 2(a) and 2(b) are descriptive view illustrating examples of a printed circuit board divided in the packaging method shown in FIG. 1.
Figure 2:
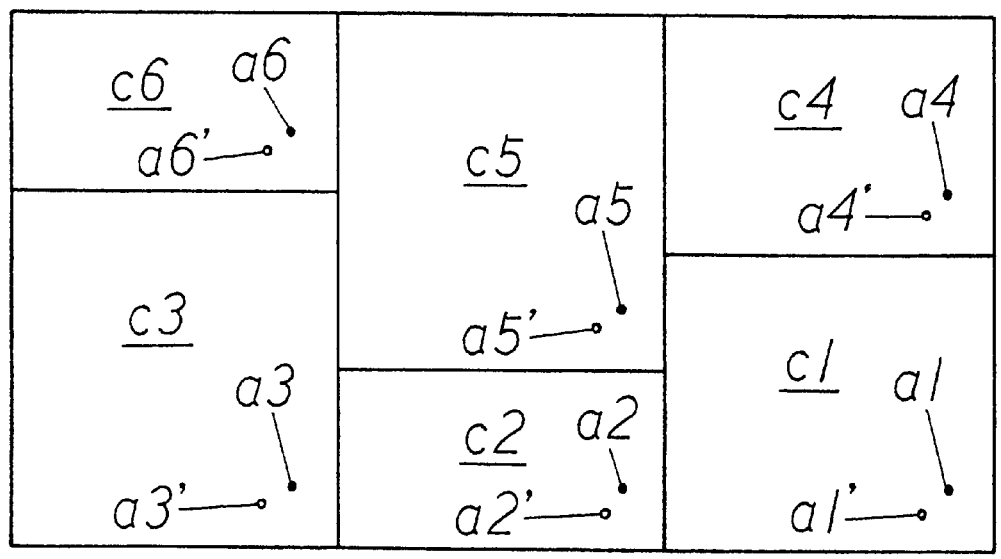

Packaging of the electronic component b in this embodiment of the present invention is accomplished through the steps of first dividing the printed circuit board c to be placed onto the packaging section m, for example, into a plurality of prescribed areas c1, c2, c3, c4, c5 and c6 as shown in FIGS. 2A and 2B on the control means 1, determining reference origins a1, a2, a3, a4, a5 and a6 for mounting an electronic component b for each of these areas c1, c2, c3, c4, c5 and c6, and previously setting the resultant values of coordinates in the control means 1.

Since it is necessary to avoid pattern drawing in an actually used printed circuit board c, the variation as shown in FIG. 2B is practicable.

The number of areas c1, c2, ... is set in response to the size and/or the extent of expansion/contraction of the printed circuit board c, or the mounting conditions of the electronic component b, and the board may be divided into more areas.

Then, prior to packaging the electronic component b onto the printed circuit board c, the mounting head 2 is transferred to above the printed circuit board c, and the reference origins a1, a2, a3, a4, a5 and a6 for the individual areas c1, c2, c3, c4, c5 and c6 are measured with the detecting means 3.

Figure 3A:
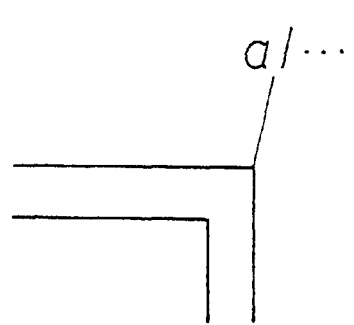
FIGS. 3(a) and 3(b) are descriptive views illustrating another embodiment of the reference origin shown in FIG. 1.
Figure 3B:
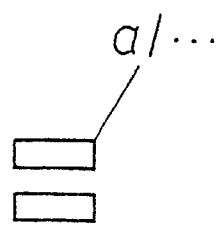
Figure 3B:

For the reference origins a1, a2 . . . , any of shapes recognizable by the CCD camera such as ●, ▲, ■ and + may be selected. An origin may be marked by printing directly on the printed circuit board c, or a sharp corner of a circuit provided on the printed circuit board c as shown in FIG. 3A or a corner of an LSI lead pad on the printed circuit board c as shown in FIG. 3B may be employed.

In the next step, corrected origins for the areas c1, c2, c3, c4, c5 and c6 available from the control means 1, respectively, are calculated and set on the basis of the reference origins a1', a2', a3', a4', a5' and a6' resulting from the measurement.

A deformation of the printed circuit board c is a material change brought about by an interior or exterior cause such as heat. Apart from a heat deformation, a deformation may be caused by the printed circuit board c itself, and in such a case, deformation is not always uniform throughout the entire surface of the printed circuit board c.

Figure 6:
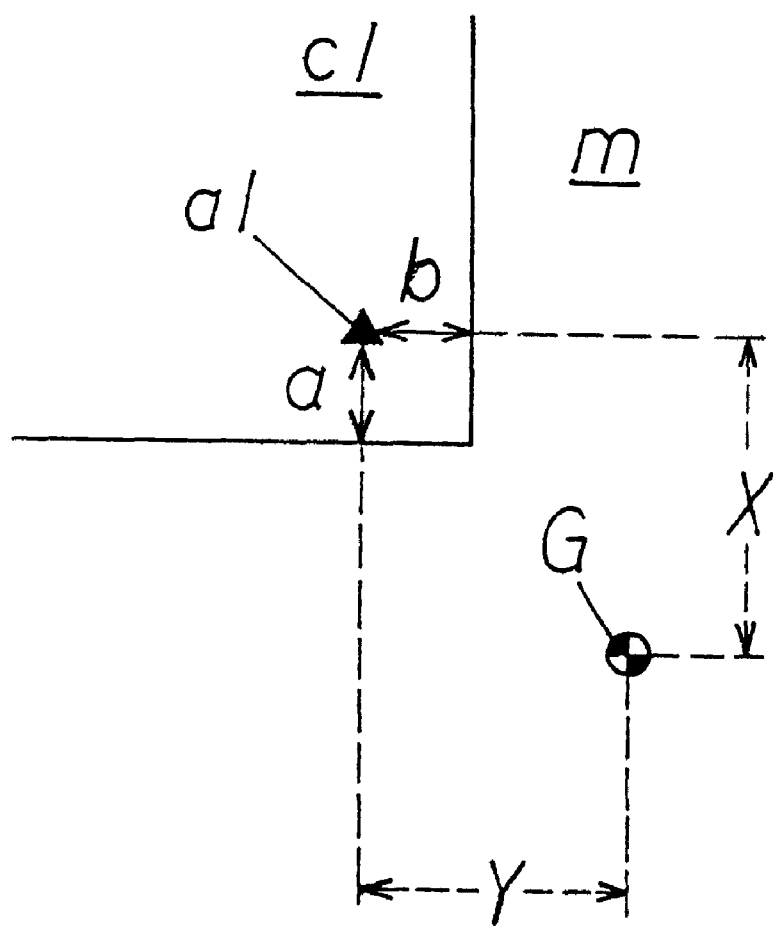
FIG. 6 is a descriptive view illustrating the relationship between the mechanical origin and the reference origin in the packaging method shown in FIG. 1.

In the foregoing step of calculating and setting corrected origins, as shown in FIG. 6, if absence of deformation in the printed circuit board c is assumed, one of the reference origins on the printed circuit board c is detected with detecting means 3 for each of the divided areas as described above, and the coordinates for the reference origin on the packaging section m obtained as a result of detection ate compared with the coordinates (X, Y) for the reference origin on the packaging section m corresponding to the coordinates a1 (a, b) of that one reference origin on the printed circuit board c, relative to the printed circuit board c placed at a prescribed position on the packaging section m so that the coordinates for the reference origin for each of the divided areas on the printed circuit board c completely agree with the coordinates of the reference origin on the packaging section corresponding to the foregoing coordinates, i.e., for example, so that the coordinates a1 (a, b) of the reference origin on the printed circuit board c agree with the coordinates (X, Y) for the reference origin on the packaging section m corresponding to the foregoing coordinates a1(a, b).

When values of these coordinates are different, the coordinates in the X and the Y directions of the mounting positions of the electronic component b based on the reference origin on the printed circuit board c in the area to which the reference origin on the printed circuit board c in the foregoing program belongs is corrected in response to the difference.

The electronic component b is thus mounted on the packaging section m by controlling the mounting head 2 on the basis of this correction.

Figure 7A:
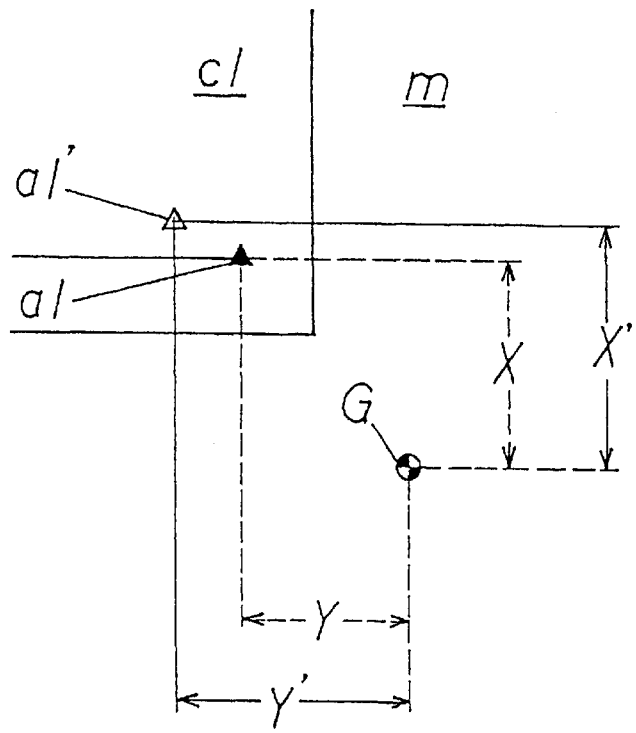
FIGS. 7(a) and 7(b) are descriptive view illustrating examples having different reference origins of areas in the packaging method shown in FIG. 1.

More specifically, in the area c1 on the printed circuit board c, as shown in FIG. 7A, the coordinates (X', Y') for the reference origin a1' on the packaging section m resulting from detection are compared with the coordinates (X, Y) for the reference origin on the packaging section m corresponding to the coordinates a1 for the reference origin on the printed circuit board c.

When values of these coordinates are different (X'>X, Y'>Y), correction is made by adding the coordinates in the X and the Y directions (X'–X, Y'–Y) of the mounting position of the electronic component b based on the reference origin on the printed circuit board c in the area c1 to which the reference origin on the printed circuit board c in the program belongs (when the values of the coordinates agree, X'=X, Y'=Y).

Figure 7B:
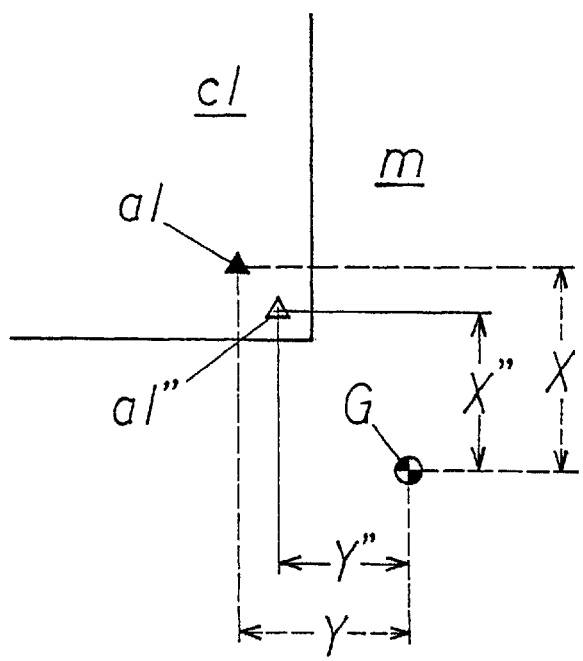

In the same area c1, as shown in FIG. 7B, the coordinates (X", Y") for the reference origin a1" on the packaging section m derived from detection are compared with the coordinates a1 (X, Y) for the reference origin on the packaging section m corresponding to the coordinates a1 of one of the reference origins on the printed circuit board c.

When the values of the coordinates are different (X>X", Y>Y"), correction is made by subtracting the coordinates in the X and the Y directions (X–X", Y–Y") of the mounting position of the electronic component b based on the reference origin on the printed circuit board c in the area c1 to which the.reference origin on the printed circuit board c in the program belongs (when the values of the coordinates agree, X"=X, Y"=Y).

Figure 8:
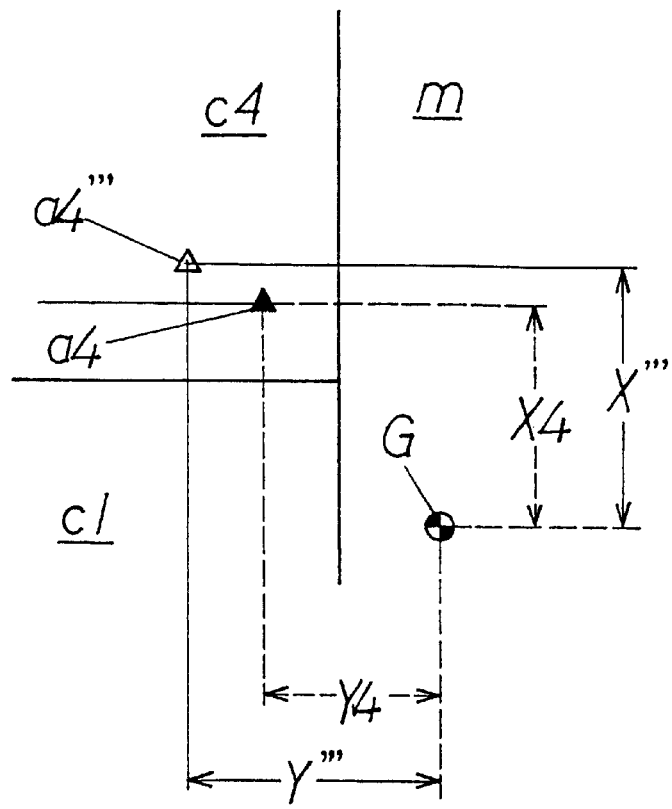
FIGS. 8(a) and 8(b) are descriptive view illustrating another examples having different reference origins in the packaging method shown in FIG. 1.
Figure 8:
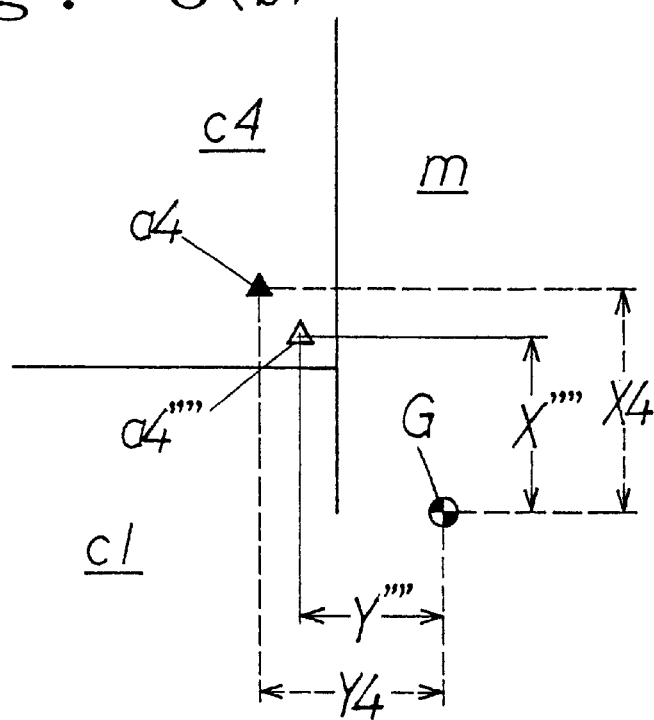
Figure 9:
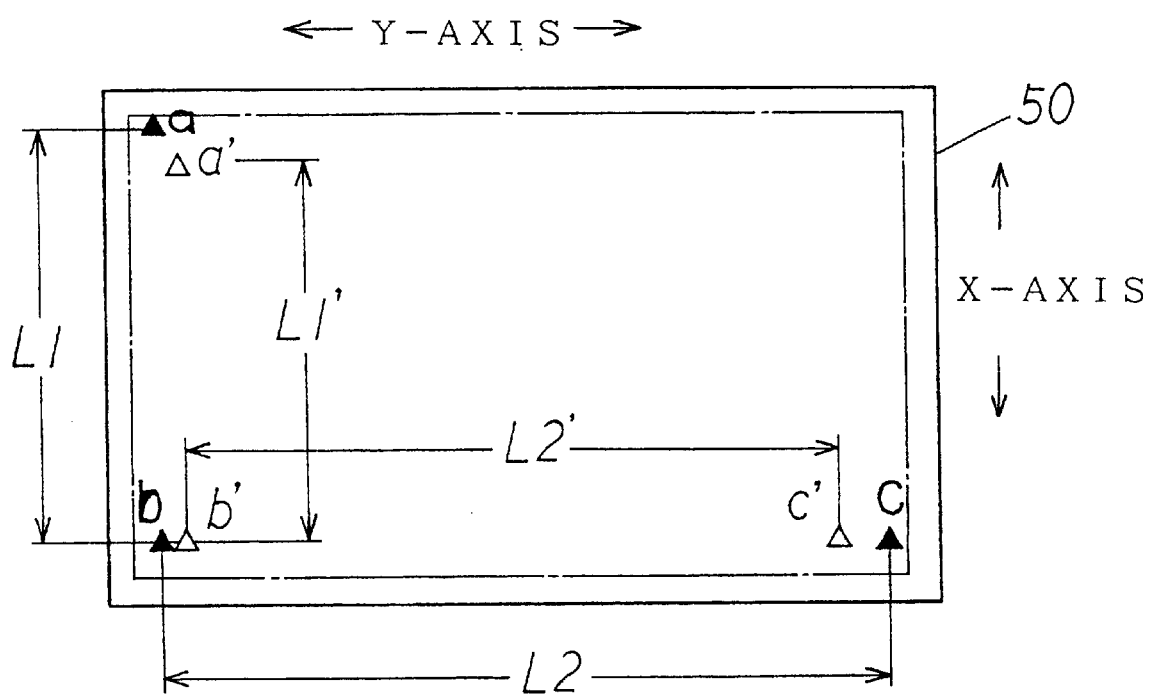
FIG. 9 is a descriptive view illustrating a conventional method of packaging an electronic component.

Thus, upon the completion of this correction, another correction is performed in the same manner as above in another area c4 on the printed circuit board c as shown in FIG. 8A as follows.

The coordinates (X''', Y''') based on the reference origin a4''' on the packaging section m resulting from detection are compared with the coordinates (X4, Y4) based on the reference origin on the packaging section m corresponding to the coordinates a4 of one of the reference origins on the printed circuit board c. When the values of these coordinates are different (X'''>X4, Y'''>Y4), correction is made by adding the coordinates in the X and the Y directions (X'''–X4, Y'''–Y4) of the mounting position of the electronic component b based on the reference origin on the printed circuit board c in the area c4 to which the reference origin on the printed circuit board c in the program belongs.

In the same area c4, as shown in FIG. 8B, the coordinates (X"", Y"") based on the reference origin a4"" on the packaging section m resulting from detection are compared with the coordinates (X4, Y4) based on the reference origin on the packaging section m corresponding to the coordinates a4 of one of the reference origins on the printed circuit board c. When the values of these coordinates are different (X4>X"", Y4>Y""), correction is made by subtracting the mounting position of the electronic component b based on the reference origin on the printed circuit board c in the area to which the reference origin on the printed circuit board c in the program belongs.

Figure 4:
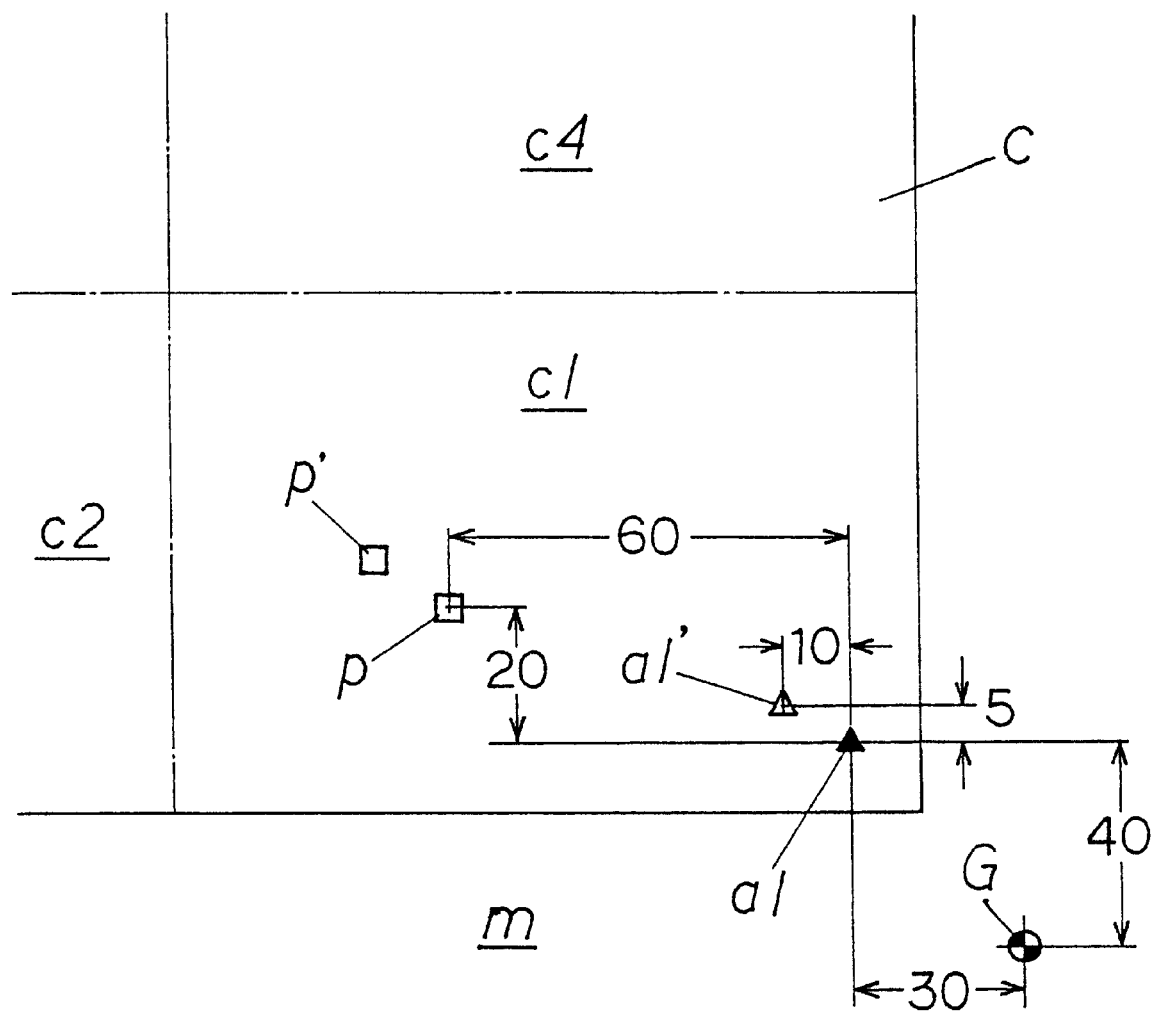
FIG. 4 is a descriptive view illustrating an embodiment of the packaging method shown in FIG. 1.

This correction of the origin will be described below further in detail with actual values of coordinates with reference to FIG. 4 for the area c1 which is an area on the printed circuit board c shown in FIG. 2A.

It is assumed that p is a mounting position of the electronic component b in the printed circuit board c, and the amount of deformation is uniform within the area c1. It is further assumed that the previously set mounting point p displaces by the same amount in the same direction. The coordinates (40, 30) based on the reference origin on the packaging section m, i.e., the amount of offset from the mechanical origin (= reference origin G on the packaging section m) is assumed to be (40, 30).

If the position a1 (0, 0) apart by (a, b) from a corner of the printed circuit boar c in the area c1 is regarded as the reference origin on the printed circuit board c, and the printed circuit board is assumed to have no deformation, the printed circuit board c is placed at a prescribed position on the packaging section m so that the coordinates a1 (0, 0) of the reference origin of the divided area c1 on the printed circuit board c agree with the coordinates (40, 30) based on the reference origin on the packaging section m corresponding to the coordinates a1 (0, 0), i.e., so that the corner of the printed circuit board c takes coordinates (X-a, Y-b) based on the reference origin on the packaging section m.

This a1 is expressed in mechanical coordinates, i.e., coordinates based on the reference origin on the packaging section m as a1(0+40, 0+30), i.e., a1(40, 30).

The value of coordinates of the mounting point p, i.e., the coordinates based on the reference origin on the printed circuit board take the value of p(20, 60), and this is expressed by mechanical coordinates of p as p(20+40, 60+30), hence p(60, 90).

When, although the corner of the printed circuit board c is placed at coordinates (X-a, Y-b) based on the reference origin on the packaging section m, a1 displaces to a1' as a result of deformation of the printed circuit board, and the amount thereof is (5, 10), the amount of offset is (40+5, 30+10), and therefore, (45, 40).

Consequently, a1 and a1' are expressed as a(40, 30) and a1'(45, 40), respectively.

The point p and the actual mounting point p' are expressed in mechanical coordinates as p(20+40, 60+30) and p'(20+45, 60+40)=p'(65, 100), respectively, and these values are set as the amounts of correction in the control means 1. Simplification by disregarding the mechanical origin, or in coordinates on the printed circuit board c, would result in p'(25, 70).

This means that only the amount of offset (amount of a1') is corrected through an addition of a subtraction of an actually measured value relative to a deformation of the printed circuit board c. Correction is carried out in the same manner also for the areas 2 . . . .

The step of mounting the prescribed electronic component b is accomplished by controlling the mounting head 2 individually for each of the areas c1, c2, c3, c4, c5 and c6 with reference to the foregoing corrected origins for the areas c1, c2, c3, c4, c5 and c6.

Figure 5:
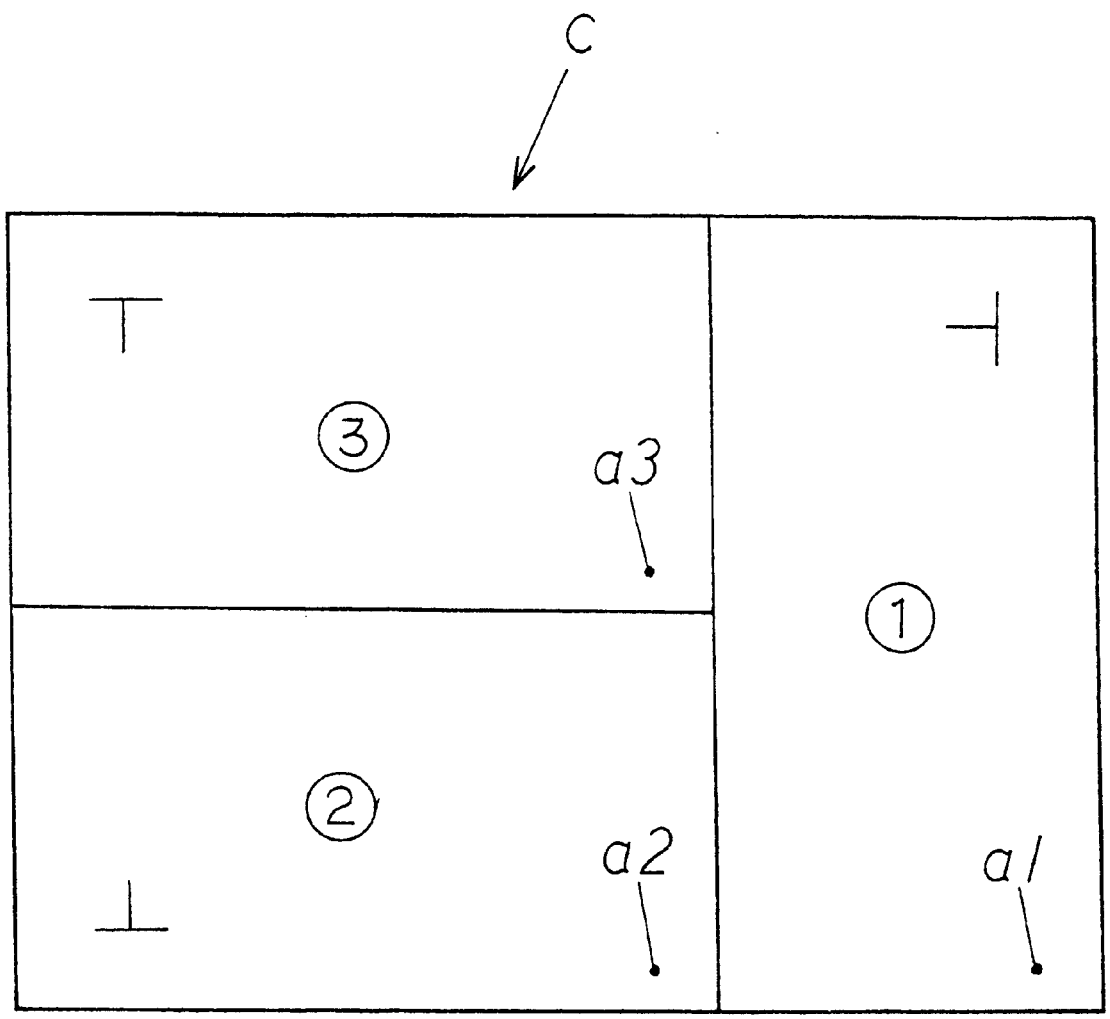
FIG. 5 is a descriptive view illustrating another configuration of the printed circuit board adopted in the method shown in FIG. 1.

As shown in FIG. 5, when a single printed circuit board c is formed by using identical printed circuit boards (1), (2) and (3), and turning the printed circuit board (2) anticlockwise by 90° and the printed circuit board (3) clockwise by 90° relative to the printed circuit board (1), a deformation of that printed circuit board c can be coped with by dividing the printed circuit boards (1), (2) and (3) into prescribed areas c1, c2 and c3, measuring respective reference origins a1, a2 and a3 with detecting means 3, setting the resultant corrected origins as offset values into the control means 1, and entering the arrangements of the individual printed circuit boards.

Even when the printed circuit boards (1), (2) and (3) are different in material, correction can be accomplished in the same manner.

In the electronic component packaging apparatus and the method thereof of the present invention, as described above, an actual mounting origin is determined by dividing a printed circuit board is divided into a plurality of areas, and carrying out measurement of reference origins provided for the individual areas, thereby determining an actual mounting origin on the basis of the data of such measurement. It is therefore possible to conduct a highly accurate numerical correction against a non-uniform deformation of the printed circuit board in the X and the Y directions, thus permitting mounting of an electronic component at a high accuracy.

Since the correction is based on addition or subtraction of measured origin of coordinates and reference origins, an error in calculation can be inhibited to the slightest level. The correction is made through a simple operation comprising only an offset correction.

What is claimed is:

1. A method of packaging an electronic component, comprising receiving the electronic component from a supply section by means of a mounting head movable in the X and the Y directions in accordance with a prescribed program entered into control means and mounting said electronic components onto a packaging section, which comprises:

a step of dividing a printed circuit board to be mounted in the packaging section into a plurality of prescribed areas, determining a reference origin for each area for mounting the electronic components, and setting the resultant coordinates previously in the control means;

a step of, prior to packaging the electronic components into the printed circuit board, measuring a reference origin for each of the areas with a detecting means;

a step of calculating and setting a corrected origin for each area by said control means on the basis of said measurement; and a step of causing control of a mounting head for each area with reference to said corrected origin for each area to mount prescribed electronic components.

2. The method of packaging electronic components according to claim 1, wherein the calculation of the corrected origin in the step of calculating and setting the corrected origin is carried out through addition/subtraction of a detected value of the detecting means and the previously set reference value.

3. A method of packaging electronic components, comprising receiving electronic components from a supply section by means of a mounting head movable in the X and the Y directions in accordance with an entered program and mounting said electronic components sequentially onto a printed circuit board placed in a packaging section, which comprises the steps of:

dividing said printed circuit board into a plurality of areas and determining a reference origin on the printed circuit board for each of the thus divided areas;

previously entering coordinates in the X and the Y directions of the mounting position of said electronic component based on the reference origin on said printed circuit board into said program;

when said printed circuit board is determined to have no deformation, carrying out the following steps so that the coordinates of the reference origin for each of the divided areas on said printed circuit board agree with the coordinates based on the reference origin on said packaging section corresponding to the foregoing coordinates, to said printed circuit board placed at a predetermined position on said packaging section:

detecting one of the reference origins on said printed circuit board for each of said divided areas by means of detecting means; comparing the coordinates based on the reference origin on said packaging section obtained from the detection with the coordinates based on the reference origin on said packaging section corresponding to the coordinates of the detected one of the reference origins on said printed circuit board; when values of the coordinates are different, correcting the coordinates in the X and the Y directions of the mounting position of said electronic component based on the reference origin on said printed circuit board within an area to which the reference origin on said printed circuit board in said program belongs in response to the different; and controlling said mounting head on the basis of this correction, thereby placing said electronic component on said packaging section.

4. The method of packaging an electronic component according to claim 3, wherein:

when comparing the coordinates (X', Y') based on the reference origin on the packaging section, resulting from detection, and the coordinates (X, Y) based on the reference origin on said packaging section corresponding to the coordinates of the one of the reference origins on the printed circuit board, and if the values of the coordinates (X'>X, Y'>Y) are different, the coordinates in the X and the Y directions (X'−X, Y'−Y) of the mounting position of said electronic component based on the reference origin on said printed circuit board within an area to which the reference origin on said printed circuit board in the program belongs is corrected through addition in response to the difference.

5. The method of packaging an electronic component according to claim 3, wherein:

when comparing the coordinates (X", Y") based on the reference origin on the packaging section, resulting from detection, and the coordinates (X, Y) based on the reference origin on said packaging section corresponding to the coordinates of the one of the reference origins on the printed circuit board, and if the values of the coordinates (X>X", Y>Y") are different, the coordinates in the X and the Y directions (X−X", Y−Y") of the mounting position of said electronic component based on the reference origin on said printed circuit board within an area to which the reference origin on said printed circuit board in the program belongs is corrected through subtraction in response to the difference.

* * * * *